(12) United States Patent
Toyoda et al.

(10) Patent No.: US 8,586,965 B2
(45) Date of Patent: Nov. 19, 2013

(54) GROUP III NITRIDE SEMICONDUCTOR LIGHT-EMITTING DEVICE

(75) Inventors: Yusuke Toyoda, Kiyosu (JP); Koji Okuno, Kiyosu (JP); Kazuki Nishijima, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/433,215

(22) Filed: Mar. 28, 2012

(65) Prior Publication Data

US 2012/0248407 A1 Oct. 4, 2012

(30) Foreign Application Priority Data

Mar. 30, 2011 (JP) ................................ 2011-074727
Sep. 28, 2011 (JP) ................................ 2011-212298

(51) Int. Cl.
*H01L 29/15* (2006.01)
(52) U.S. Cl.
USPC ........ 257/14; 257/17; 257/103; 257/E33.013; 438/22
(58) Field of Classification Search
USPC .......... 257/13–15, 96, 97; 372/43.01, 45.012, 372/50.121
See application file for complete search history.

(56) References Cited

U.S. PATENT DOCUMENTS

| 2005/0127391 A1 | 6/2005 | Yanamoto |
| 2008/0093593 A1 | 4/2008 | Ryu |
| 2008/0203418 A1 | 8/2008 | Yanamoto |
| 2008/0308787 A1* | 12/2008 | Lee et al. ......................... 257/13 |
| 2009/0152586 A1 | 6/2009 | Lee et al. |
| 2010/0219395 A1* | 9/2010 | Hirayama et al. ............... 257/13 |
| 2010/0288999 A1* | 11/2010 | Kikuchi et al. .................. 257/13 |
| 2011/0303896 A1* | 12/2011 | Brandes .......................... 257/13 |
| 2012/0189030 A1* | 7/2012 | Miyoshi .................... 372/45.012 |

FOREIGN PATENT DOCUMENTS

| JP | 2003-273473 A | 9/2003 |
| JP | 2008-103711 A | 5/2008 |
| JP | 2009-152552 A | 7/2009 |
| WO | WO 2011013621 A1 * | 2/2011 |

* cited by examiner

*Primary Examiner* — Matthew W Such
*Assistant Examiner* — Stephen Bradley
(74) *Attorney, Agent, or Firm* — McGinn Intellectual Property Law Group, PLLC

(57) ABSTRACT

A Group III nitride semiconductor light-emitting device includes a light-emitting layer having a multiple quantum structure including an $Al_xGa_{1-x}N$ (0<x<1) layer as a barrier layer. When the light-emitting layer is divided into three blocks including first, second and third blocks in the thickness direction from the n-type-layer-side cladding layer to the p-type-layer-side cladding layer, the number of barrier layers are the same in the first and third blocks, and the Al composition ratio of each light-emitting layer is set to satisfy a relation $x+z=2y$ and $z<x$ where an average Al composition ratio of the barrier layers in the first block is represented as x, an average Al composition ratio of the barrier layers in the second block is represented as y, and an average Al composition ratio of the barrier layers in the third block is represented as z.

20 Claims, 7 Drawing Sheets

GROUP III NITRIDE SEMICONDUCTOR LIGHT-EMITTING DEVICE

BACKGROUND OF THE INVENTION

1. Field of the Invention

The present invention relates to a Group III nitride semiconductor light-emitting device which suppresses an increase in driving voltage and which exhibits improved emission performance.

2. Background Art

Hitherto, various known Group III nitride semiconductor light-emitting devices are known, and some of them are disclosed in Japanese Patent Application Laid-Open (kokai) No. 2008-103711. Japanese Patent Application Laid-Open (kokai) No. 2008-103711 discloses a Group III nitride semiconductor light-emitting device including an active layer having a structure in which the closer to an n-type contact layer, the larger a bandgap energy of an InGaN well layer; the closer to an n-type contact layer, the smaller the thickness of a well layer; and the closer to an n-type contact layer, the larger a bandgap energy of an InGaN barrier layer. This structure eliminates the nonuniformity of emission wavelength.

Moreover, Japanese Patent Application Laid-Open (kokai) No. 2009-152552 discloses a Group III nitride semiconductor light-emitting device including an active layer having a structure in which the thickness of a barrier layer is gradually increased as getting closer to a p-type layer to suppress overflow of carriers.

Further, Japanese Patent Application Laid-Open (kokai) No. 2003-273473 discloses a Group III nitride semiconductor light-emitting device including an active layer having a structure, the active layer comprising three layers of a barrier layer, a well layer, and a barrier layer, in which a bandgap energy of a barrier layer on the n-type layer side is larger than that of a barrier layer on the p-type layer side, and the thickness of a barrier layer on the n-type layer side is smaller than that of a barrier layer on the p-type layer side.

However, even in the Group III nitride semiconductor light-emitting device having the above structure, emission performance is required to be further improved. In the active layer of MQW (Multiple Quantum Well) structure, the electron diffusion length is larger than the hole diffusion length. Therefore, in the MQW structure, electrons injected from the n-type cladding layer to the active layer reaches the p-type cladding layer, and confined in the active layer by the barrier. As a result, more electrons are captured in the well layer closer to the p-type cladding layer. That is, the electron density distribution in the well layer of the active layer increases as getting closer to the p-type cladding layer. Thus, holes injected from the p-type cladding layer to the active layer are more recombined with the electrons confined in the well layer having a high electron density closer to the p-type cladding layer.

This leads to a problem that the emission region in the active layer is concentrated closer to the p-type cladding layer, causing a decrease in the total light output and the emission performance of the light-emitting device.

SUMMARY OF THE INVENTION

In view of the foregoing, an object of the present invention is to improve the emission output and performance of a Group III nitride semiconductor light-emitting device without increasing driving voltage.

In a first aspect of the present invention, there is provided a Group III nitride semiconductor light-emitting device comprising at least an n-type-layer-side cladding layer, a light-emitting layer having a multiple quantum structure in which $Al_xGa_{1-x}N$ (0<x<1) layer acts as a barrier layer, and a p-type-layer-side cladding layer, each of the layers being formed of a Group III nitride semiconductor, wherein, when the light-emitting layer is divided into three blocks of the first block, the second block, and the third block in the thickness direction from the n-type-layer-side cladding layer to the p-type-layer-side cladding layer, the Al composition ratio of each light-emitting layer is set to satisfy z<y<x where an average Al composition ratio of the barrier layer in the first block is represented as x, an average Al composition ratio of the barrier layer in the second block is represented as y, and an average Al composition ratio of the barrier layer in the third block is represented as z.

In the present invention, any number of barrier layers may be included in the first, second, and third blocks. The number of the barrier layers in the first block is preferably equal to the number of barrier layers in the third block. Moreover, the Al composition ratio of the barrier layers in the same block may be different or the same. Further, even if the Al composition ratio of the barrier layers are monotonously decreased from the n-type-layer-side cladding layer, any Al composition ratio distribution may be possible in the same block if an average Al composition ratio of the barrier layers in each block satisfies the relation z<y<x. However, preferably, the Al composition ratios of the barrier layers are monotonously decreased from n-type-layer-side cladding layer.

In a second aspect of the present invention, The number of the barrier layers in the first block is equal to the number of the barrier layers in the third block, and the Al composition ratio of each barrio layer is set so as to satisfy x+z=2y in the first aspect of the present invention. The number of the barrier layers in the first and third blocks is represented as k, and the total number of the barrier layers in the light-emitting layer is represented as n. In the present invention, an average Al composition ratio x of the barrier layers in the first block, an average Al composition ratio y of the barrier layers in the second block, and an average Al composition ratio z of the barrier layers in the third block are determined by the following equation, where z<x:

$$xk+y(n-2k)+zk=yn$$

$$x+z=2y \quad (1)$$

Eq. 1 is also expressed as Eq. 2.

$$x-y=y-z \quad (2)$$

Eq. 2 is also expressed as Eq. 3.

$$x/y-1=1-z/y \quad (3)$$

In the second aspect of the present invention, the design is made so that the number of the barrier layers in the first block is equal to the number of the barrier layers in the third blocks, an average Al composition ratio x of the barrier layers in the first block is larger than an average Al composition ratio z of the barrier layers in the third block, and an arithmetic average of the average Al composition ratio x of the barrier layers in the first block and the average Al composition ratio z of the barrier layers in the third block is equal to the average Al composition ratio y of the barrier layers in the second block.

In other words, the deviation (x−y), i.e., the deviation of the average Al composition ratio x of the barrier layers in the first block to the average Al composition ratio y of the barrier layers in the second block, is equal to the deviation (y−z), i.e., the deviation of the average Al composition ratio y of the barrier layers in the second block to the average Al composition ratio z of the barrier layers in the third block. Moreover, the deviation (x/y−1), i.e., the deviation of the ratio x/y of the average Al composition ratio x of the barrier layers in the first block to the average Al composition ratio y of the barrier layers in the second block to 1, is equal to the deviation (1−z/y), i.e., the deviation of 1 to the ratio z/y of the average Al composition ratio z of the barrier layer in the third block to the average Al composition ratio y of the barrier layer in the second block. The Group III nitride semiconductor light-emitting device of the present invention exhibits improved emission performance by the above mentioned symmetry in the average Al composition ratio distribution of the barrier layers in three blocks of the light-emitting layer. Most preferably, the Al composition ratios of a plurality of barrier layers which exist in the same block may be the same. In this case, the Al composition ratios of all the barrier layers are equal to x in the first block. The Al composition ratios of all the barrier layers are equal to y in the second block. The Al composition ratios of all the barrier layers are equal to z in the third block. This is applied in the following inventions.

In a third aspect of the present invention, the ratio x/y of the average Al composition ratio x of the barrier layers in the first block to the average Al composition ratio y of the barrier layers in the second block is $1.1 \leq x/y \leq 2.2$ in the second aspect of the present invention. When the ratio of the average Al composition ratios of the barrier layers is set within this range so as to be symmetrical, emission performance can be remarkably improved.

In a fourth aspect of the present invention, the thickness of the barrier layers in each block is set so as to satisfy at least one of $a<b<c$ and $c<b<a$ where the average thickness of the barrier layers in the first block is represented as a, the average thickness of the barrier layers in the second block as b, and the average thickness of the barrier layers in the third block as c, in the first through third aspects of the present invention. The average thickness of the barrier layers in each block are monotonously increased or decreased in the direction of the p-type-layer-side cladding layer. The thickness of a plurality of barrier layers in each block may be the same or different, but preferably the same. The average thickness a, b, and c of the barrier layers in each block should satisfy the above relations.

In a fifth aspect of the present invention, the number of the barrier layers in the first block is equal to the number of the barrier layers in the third block, and the thickness of each barrier layer is set so as to satisfy $a+c=2b$, in the fourth aspect of the present invention. In the present invention, the average thickness of the barrier layers in each block is determined by the following equation:

$$ak+b(n-2k)+ck=bn$$

$$a+c=2b \quad (4)$$

Eq. 4 is also expressed as Eq. 5.

$$b-a=c-b \quad (5)$$

Eq. 5 is also expressed as Eq. 6.

$$1-a/b=c/b-1 \quad (6)$$

In the present invention, the design is made so that the number of the barrier layers in the first block is equal to the number of the barrier layers in the third block, and an arithmetic average of the average thickness a of the barrier layers in the first block and the average thickness c of the barrier layers in the third block is equal to the average thickness b of the barrier layers in the second block. In the fifth aspect of the present invention, the case where the relation $a<b<c$ is satisfied and the case where the relation $c<b<a$ is satisfied in the average thickness of the barrier layers are included in the scope of the patented invention.

In other words, the deviation (b−a), i.e., the deviation of the average thickness b of the barrier layers in the second block to the average thickness a of the barrier layers in the first block, is equal to the deviation (c−b), i.e., the deviation of the average thickness c of the barrier layers in the third block to the average thickness b of the barrier layers in the second block. Moreover, the deviation (1−a/b), i.e., the deviation of 1 to the ratio a/b of the average thickness a of the barrier layers in the first block to the average thickness b of the barrier layers in the second block, is equal to the deviation (c/b−1), i.e., the deviation of the ratio c/b of the average thickness c of the barrier layers in the third block to the average thickness b of the barrier layers in the second block to 1. The Group III nitride semiconductor light-emitting device of the present invention exhibits improved emission performance by the above mentioned symmetry in the average Al composition ratio distribution and the average thickness distribution of the barrier layers in the light-emitting layer. Most preferably, the thicknesses of a plurality of barrier layers which exist in the same block may be the same. In this case, the thicknesses of all the barrier layers are equal to a in the first block. The thicknesses of all the barrier layers are equal to b in the second block. The thicknesses of all the barrier layers are equal to c in the third block. This is applied in the following inventions.

In a sixth aspect of the present invention, the average thickness a of the barrier layers in the first block and the average thickness c of the barrier layers in the third block are set so as to satisfy the relation $a<c$, in the fifth aspect of the present invention. That is, when the average thickness of the barrier layers closer to the p-type-layer-side cladding layer is larger than that of the barrier layers closer to the n-type-layer-side cladding layer, the thickness of the barrier layer suppresses the overflow of electrons due to the low height of the barrier layer by reducing the Al composition ratio of the barrier layers in the third block.

In a seventh aspect of the present invention, the ratio a/b is set within a range of 0.7 to 0.9 in the case of $a<b<c$, and the ratio c/b is set within a range of 0.7 to 0.9 in the case of $c<b<a$, in the fifth aspect of the present invention. When the ratio of the average thicknesses of the barrier layers is set within this range so as to be symmetrical, emission performance can be remarkably improved.

In an eighth aspect of the present invention, there is provided a Group III nitride semiconductor light-emitting device comprising at least an n-type-layer-side cladding layer, a light-emitting layer having a multiple quantum structure including the $Al_xGa_{1-x}N$ ($0<x<1$) layer as a barrier layer, and a p-type-layer-side cladding layer, each of the layers being formed of a Group III nitride semiconductor, wherein when the light-emitting layer is divided into three blocks of the first block, the second block, and the third block in the thickness direction from the n-type-layer-side cladding layer to the p-type-layer-side cladding layer, the Al composition ratio of the barrier layers are the same in the first, second, and third blocks, and the thickness of each barrier layer is set so as to satisfy at least one of the relations $a<b<c$ and $c<b<a$ where an average thickness of the barrier layers in the first block is represented as a, an average thickness of the barrier layers in the second block as b, and an average thickness of the barrier layers in the third block as c.

In the present invention, the Al composition ratio of the barrier layers are the same in the first, second, and third blocks, and the average thicknesses of the barrier layers in the first, second, and third blocks are symmetrical as in the fourth aspect of the present invention.

In a ninth aspect of the present invention, the number of the barrier layers in the first block is equal to the number of the barrier layers in the third block, and the thickness of each barrier layer is set to so as to satisfy a+c=2b, in the eight aspect of the present invention. Further, in a tenth aspect of the present invention, the average thickness a of the barrier layers in the first block and the average thickness c of the barrier layers in the third block are set so as to satisfy the relation a<c, in the ninth aspect of the present invention. In this case, when the average thickness of the barrier layers closer to the p-type-layer-side cladding layer is larger than that of the barrier layers closer to the n-type-layer-side cladding layer, the overflow of electrons to the p-type-layer-side cladding layer is suppressed, resulting in improvement of emission performance.

In an eleventh aspect of the present invention, the ratio a/b is set within a range of 0.7 to 0.9 in the case of a<b<c, and the ratio c/b is set within a range of 0.7 to 0.9 in the case of c<b<a, in the ninth aspect of the present invention. When the ratio of the average thicknesses of the barrier layers is set within this range so as to be symmetrical, emission performance can be remarkably improved.

In the semiconductor light-emitting device according to all the above aspects of the present invention, generally an n-type contact layer for forming an n-electrode is provided below the n-type cladding layer, and a p-type contact layer for forming a p-electrode is provided above the p-type-layer-side cladding layer. The semiconductor light-emitting device of the present invention may include a layer other than the aforementioned layers. The light-emitting layer has a multiple quantum structure, and may have any number of layers. One layer unit of a periodic layer structure may include at least a well layer and a barrier layer, and may additionally include a layer other than the aforementioned layers. The number of layer units is an integer 3 or more.

Preferably, the p-type-layer-side cladding layer has a supper lattice layer including an $Al_xGa_{1-x}N$ (0<z<1) layer. The n-type-layer-side cladding layer preferably has a superlattice layer including an $Al_xGa_{1-x}N$ (0≤x<1) layer. Moreover, the n-type-layer-side cladding layer may have a superlattice layer including an $In_yGa_{1-y}N$ (0<y<1) layer, an $Al_xGa_{1-x}N$ (0<x<1) layer, and a GaN layer. At least one layer of these super lattice layers preferably contains Si. Needless to say, all the layers forming the n-type-layer-side cladding layer may contain Si.

The p-type-layer-side cladding layer may be a superlattice layer having a periodic structure including an $In_wGa_{1-w}N$ layer and an $Al_xGa_{1-x}N$ (0<z<1) layer. With this configuration, electrons can be effectively confined in the light-emitting layer, and holes can be effectively injected into the light-emitting layer. As a result, emission performance can be improved. As used herein, "Group III nitride semiconductor" encompasses a compound semiconductor represented by the formula $Al_{x1}Ga_{y1}In_{z1}N$ (x1+y1+z1=1, 0≤x1, y1, z1≤1); such a compound semiconductor in which a portion of Al, Ga, or In is substituted by another Group 13 element (i.e., B or Tl), or a portion of N is substituted by another Group 15 element (i.e., P, As, Sb, or Bi). Generally, the Group III nitride semiconductor is one containing Ga as an essential element, such as GaN, AlGaN, InGaN, or AlGaInN.

The light-emitting layer may have a multiple quantum structure. Examples of the multiple quantum structure which may be employed include a multiple quantum structure of AlGaN/GaN having any composition ratio, a multiple quantum structure of AlGaN/InGaN having any composition ratio, and a multiple quantum structure of AlGaN/GaN/InGaN having any composition ratio. The semiconductor light-emitting device of the present invention may further include a layer other than those described above, such as an n-type contact layer or a p-type contact layer. A layer for improving electrostatic breakdown voltage (hereinafter may be referred to as an "ESD layer") may be provided between the n-contact layer and the n-type-layer-side cladding layer. The device may have any other layer configuration.

In the present invention, when the light-emitting layer is divided into three blocks of the first block, the second block, and the third block in the thickness direction from the n-type-layer-side cladding layer to the p-type-layer-side cladding layer, the Al composition ratio of each barrier layer is set so as to satisfy z<y<x where an average Al composition ratio of the barrier layers in the first block is represented as x, an average Al composition ratio of the barrier layers in the second block is represented as y, and an average Al composition ratio of the barrier layers in the third block is represented as z. This leads to a higher barrier height of the barrier layer closer to the n-type-layer-side cladding layer. Therefore, electrons of the light-emitting layer are also stored in the well layer close to the n-type-layer-side cladding layer. The electron density distribution can be uniformed in the whole thickness direction of the light-emitting layer, and the light-emitting region can be uniformed in the whole thickness direction. Thus, emission performance can be improved.

When the number of the barrier layers in the first block is equal to the number of the barrier layers in the third block, and the Al composition ratio of each layer is set so as to satisfy the relation x+z=2y, the Al composition ratio distribution is larger on the n-type-layer-side cladding layer side and lower on the p-type-layer-side cladding layer side. Additionally, it is point-symmetrical with respect to the center of the thickness. As a result, electrons are also stored in the well layer close to the n-type-layer-side cladding layer. The electron density distribution can be uniformed in the whole thickness direction of the light-emitting layer, and the light-emitting region can be uniformed in the whole thickness direction. Thus, emission performance can be improved.

The thickness of the barrier layer in each block described above is set so as to satisfy the relation a<b<c or c<b<a where an average thickness of the barrier layers in the first block is represented as a, an average thickness of the barrier layers in the second block as b, and an average thickness of the barrier layers in the third block as c. Therefore, emission performance can be improved.

When the number of the barrier layers in the first block is equal to the number of the barrier layers in the third block, and the thickness of each barrier layer is set so as to satisfy a+c=2b, the thickness distribution of the barrier layer can be point-symmetrical with respect to the center in the thickness direction of the light-emitting layer. This can improve emission performance. Especially, when the average thickness of the barrier layers in the third block close to the p-type-layer-side cladding layer is larger than that of the barrier layers in the first block close to the n-type-layer-side cladding layer, the overflow of electrons to the p-type-layer-side cladding layer can be prevented, resulting in improvement of emission performance.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
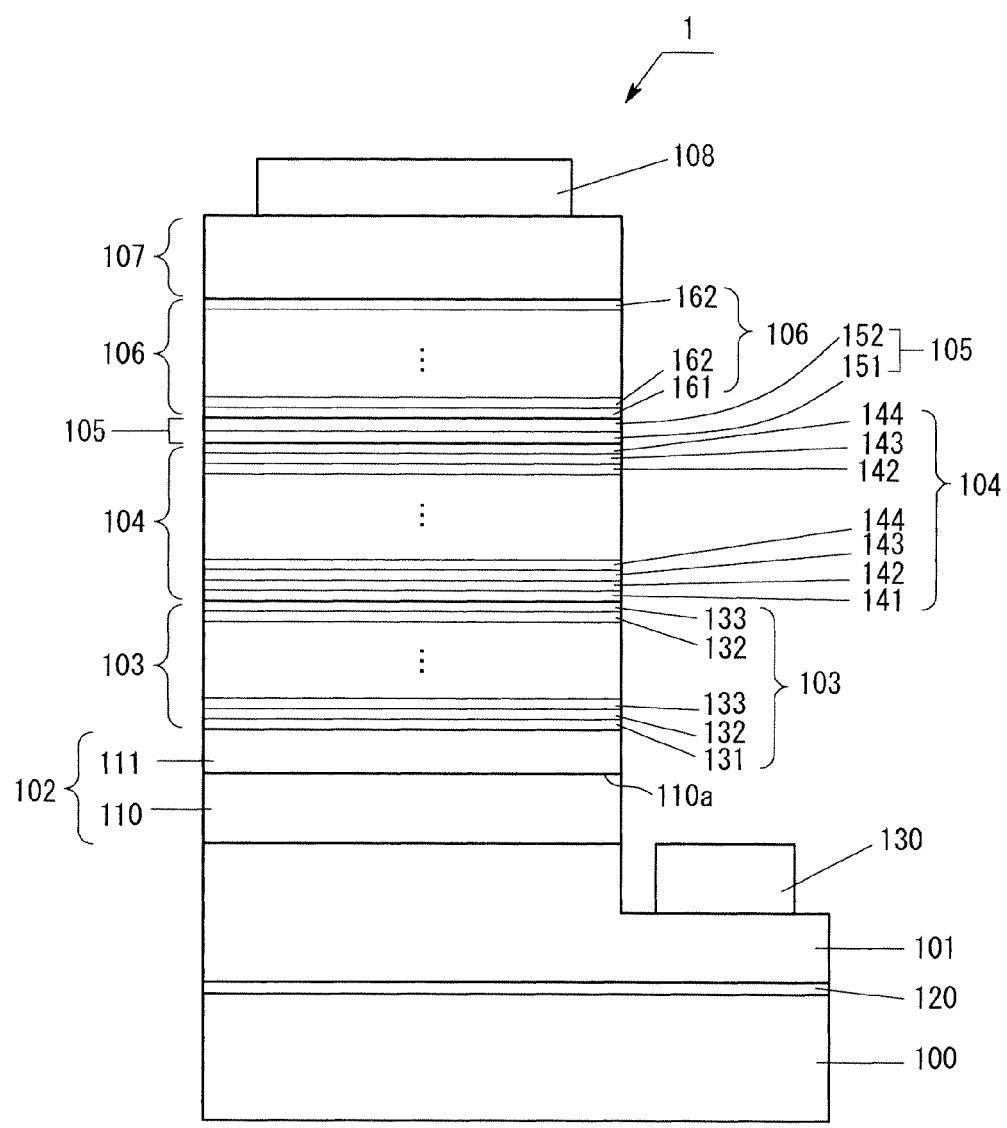
FIG. 1 shows the configuration of a light-emitting device 1 according to Embodiment 1.

FIG. 1 shows the configuration of a light-emitting device 1 according to Embodiment 1. The light-emitting device 1 has a structure including a sapphire substrate 100; an AlN buffer layer 120; an n-type contact layer 101, an ESD layer 102, an n-type-layer-side cladding layer (referred to as "n-type cladding layer" throughout the Embodiments) 103, a light-emitting layer 104, an undoped cladding layer 105, a p-type-layer-side cladding layer (referred to as "p-type cladding layer" throughout the Embodiments) 106, and a p-type contact layer 107, the layers 101 to 107 being formed of a Group III nitride semiconductor and deposited on the substrate 100 via the buffer layer 120; a p-electrode 108 formed on the p-type contact layer 107; and an n-electrode 130 formed on a portion of the n-type contact layer 101 exposed through removal of the corresponding portions of the layers 102 to 107 by etching from the p-type contact layer 107.

The surface of the sapphire substrate 100 is embossed for improving light extraction performance. The sapphire substrate may be replaced with another growth substrate made of, for example, SiC, ZnO, Si, or GaN.

The n-type contact layer 101 is formed of n-GaN having an Si concentration of $1\times10^{18}/cm^3$ or more. The n-type contact layer 101 may be formed of a plurality of layers having different carrier concentrations for attaining good contact between the layer 101 and the n-electrode 130.

The ESD layer 102 has a two-layer structure including a first ESD layer 110, and a second ESD layer 111, the layers 110 and 111 being sequentially deposited on the n-type contact layer 101. The first ESD layer 110 is formed of undoped GaN. The first ESD layer 110 has a thickness of 50 to 500 nm. The surface 110a of the first ESD layer 110 has a few pits having a density of $2\times10^8/cm^2$ or more. The second ESD layer 111 is formed of GaN doped with Si, and has a thickness of 25 to 50 nm. The first ESD layer 110 may be doped with Si such that the layer has a carrier concentration of $5\times10^{17}/cm^3$ or less.

The second ESD layer 111 is formed of GaN doped with Si, and has a characteristic value, as defined by the product of Si concentration ($/cm^3$) and thickness (nm), of $0.9\times10^{20}$ to $3.6\times10^{20}$ ($nm/cm^3$). For example, when the second ESD layer 111 has a thickness of 30 nm, the layer has an Si concentration of $3.0\times10^{18}/cm^3$ to $1.2\times10^{19}/cm^3$.

The n-type cladding layer 103 has a superlattice structure including 15 layer units, each including sequentially stacked three layers: an undoped $In_{0.08}Ga_{0.92}N$ layer 131 (thickness: 2.5 nm), an undoped GaN layer 132 (thickness: 0.7 nm), and an Si-doped n-GaN layer 133 (thickness: 1.4 nm). The initial layer of the n-type cladding layer 103, which is in contact with the second ESD layer 111, is the $In_{0.08}Ga_{0.92}N$ layer 131, and the final layer of the n-type cladding layer 103, which is in contact with the light-emitting layer 104, is the n-GaN layer 133. The overall thickness of the n-type cladding layer 103 is 69 nm. The $In_{0.08}Ga_{0.92}N$ layer 131 may have a thickness of 1.5 nm to 5.0 nm. The undoped GaN layer 132 may have a thickness of 0.3 nm to 2.5 nm. The Si-doped n-GaN layer 133 may have a thickness of 0.3 nm to 2.5 nm.

The light-emitting layer (may also be referred to as "active layer") 104 is divided into three blocks of the first block, the second block, and the third block in the thickness direction from the n-type-layer-side cladding layer 103. In the first block, two layer units are provided, each including sequentially stacked four layers: an $Al_{0.05}Ga_{0.95}N$ layer 141 (thickness: 2.4 nm), an $In_{0.2}Ga_{0.8}N$ layer 142 (thickness: 3.2 nm), a GaN layer 143 (thickness: 0.6 nm), and an $Al_{0.33}Ga_{0.66}N$ layer 144 (thickness: 0.6 nm). In the second block, three layer units are provided, each including sequentially stacked four layers: an $Al_{0.05}Ga_{0.95}N$ layer 141 (thickness: 2.4 nm), an $In_{0.2}Ga_{0.8}N$ layer 142 (thickness: 3.2 nm), a GaN layer 143 (thickness: 0.6 nm), and an $Al_{0.2}Ga_{0.8}N$ layer 144 (thickness: 0.6 nm). In the third block, two layer units are provided, each including sequentially stacked four layers: an $Al_{0.05}Ga_{0.95}N$ layer 141 (thickness: 2.4 nm), an $In_{0.2}Ga_{0.8}N$ layer 142 (thickness: 3.2 nm), a GaN layer 143 (thickness: 0.6 nm), and an $Al_{0.07}Ga_{0.93}N$ layer 144 (thickness: 0.6 nm). In the present embodiment, two $Al_{0.33}Ga_{0.66}N$ layers 144 in the first block, three $Al_{0.2}Ga_{0.8}N$ layers 144 in the second block, and two $Al_{0.07}Ga_{0.93}N$ layers 144 in the third block are respectively a barrier layer 144 of the present invention. The $In_{0.2}Ga_{0.8}N$ layer 142 is a well layer 142. The $Al_{0.05}Ga_{0.95}N$ layer 141 is also a barrier layer. When the $Al_{0.05}Ga_{0.95}N$ layer 141 is a barrier layer, the GaN layers 143 and subsequent layers 144 are sometimes referred to as a cap layer of the $Al_{0.05}Ga_{0.95}N$ layer 141. Each of the layers 144 followed by the $Al_{0.05}Ga_{0.95}N$ layer 141 has a larger bandgap than that of the well layer 142, and acts as a barrier layer to confine the carriers in the well layer 142. Therefore, Embodiments 1 to 4 describe the case when each of the layers 144 is a barrier layer. Embodiments 5 to 8 describe the case when each of the layers 141 is a barrier layer.

Hereinafter, the reference numerals 144 and 142 are also assigned to a barrier layer and a well layer, respectively.

The initial layer of the light-emitting layer 104, which is in contact with the n-type cladding layer 103, is the $Al_{0.05}Ga_{0.95}N$ layer 141, and the final layer of the light-emitting layer 104, which is in contact with the undoped cladding layer 105, is the $Al_{0.2}Ga_{0.8}N$ layer 144. One layer unit has a thickness of 6.8 nm. The overall thickness of the light-emitting layer 104 is 47.6 nm. All the layers of the light-emitting layer 104 are formed of undoped layers. The undoped cladding layer 105, which comprises an undoped GaN layer 151 (thickness: 2.5 nm) and an undoped $Al_{0.15}Ga_{0.85}N$ layer 152 (thickness: 3 nm), is interposed between the light-emitting layer 104 and the p-type cladding layer 106. The undoped cladding layer 105 is provided for the purpose of preventing diffusion of Mg contained in the layers formed above the layer 105 to the light-emitting layer 104.

The p-type cladding layer 106 has a structure including seven layer units, each including a p-$In_{0.05}Ga_{0.95}N$ layer 161 (thickness: 1.7 nm) and a p-$Al_{0.3}Ga_{0.7}N$ layer 162 (thickness: 3.0 nm) which are sequentially stacked. The initial layer of the p-type cladding layer 106, which is in contact with the undoped cladding layer 105, is the p-$In_{0.05}Ga_{0.95}N$ layer 161, and the final layer of the p-type cladding layer 106, which is in contact with the p-type contact layer 107, is the p-$Al_{0.3}Ga_{0.7}N$ layer 162. The overall thickness of the p-type cladding layer 106 is 32.9 nm. Mg is employed as a p-type impurity.

The p-type contact layer 107 is formed of p-GaN doped with Mg. The p-type contact layer 107 may be formed of a plurality of layers having different carrier concentrations for attaining good contact between the layer 107 and the p-electrode.

Since the ESD layer 102 has the aforementioned configuration, the light-emitting device 1 exhibits high electrostatic breakdown voltage, improved emission performance and reliability, and reduced current leakage. Next will be described the reason why the ESD layer 102 is configured as mentioned above. The ESD layer 102 is configured such that, firstly, the first ESD layer 110 having pits (pit density: $2\times10^8/cm^2$ or more) is formed; and the second ESD layer 111 doped with Si is formed on the first ESD layer 110. The presence of Si in the pits of the first ESD layer 110 produces conductivity at this position. With this configuration, high electrostatic breakdown voltage is attained. The thickness of the first ESD layer 110 is adjusted to 50 nm to 500 nm so that electrostatic breakdown voltage and emission performance are not reduced, and so that the pit size is regulated so as not to cause an increase in current leakage.

In order to further improve electrostatic breakdown voltage, emission performance, and reliability, and to reduce current leakage, preferably, the ESD layer 102 is configured as follows. The first ESD layer 110 preferably has a thickness of 50 nm to 500 nm, and a pit density of $2\times10^8/cm^2$ to $1\times10^{10}/cm^2$ or less. The second ESD layer 112 preferably has a characteristic value of $1.5\times10^{20}$ nm/$cm^3$ to $3.6\times10^{20}$ nm/$cm^3$ and a thickness of 25 nm to 50 nm.

Next will be described a method for producing the light-emitting device 1 with reference to FIG. 2. In FIG. 2, description of the periodic structures of the superlattice layers shown in FIG. 1 is omitted.

Crystal growth is carried out through metal-organic chemical vapor deposition (MOCVD). The gases employed are as follows: hydrogen or nitrogen ($H_2$ or $N_2$) as a carrier gas; ammonia gas ($NH_3$) as a nitrogen source; trimethylgallium ($Ga(CH_3)_3$, hereinafter may be referred to as "TMG") as a Ga source; trimethylindium ($In(CH_3)_3$, hereinafter may be referred to as "TMI") as an In source; trimethylaluminum ($Al(CH_3)_3$, hereinafter may be referred to as "TMA") as an Al source; silane ($SiH_4$) as an n-type dopant gas; and cyclopentadienylmagnesium ($Mg(C_5H_5)_2$, hereinafter may be referred to as "$Cp_2Mg$") as a p-type dopant gas.

Figure 2A:
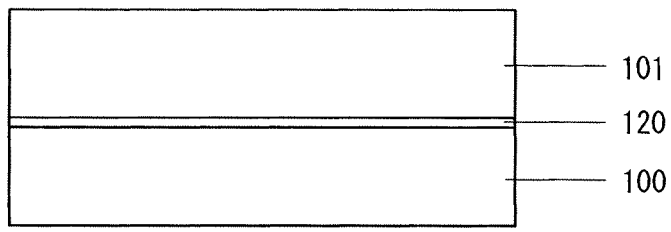
FIGS. 2A to 2C are sketches showing processes for producing the light-emitting device 1.

Firstly, the sapphire substrate 100 was heated in a hydrogen atmosphere for cleaning, to thereby remove deposits from the surface of the sapphire substrate 100. Thereafter, the substrate temperature was maintained at 400° C., and the AlN buffer layer 120 was formed on the sapphire substrate 100 through MOCVD. Then, the substrate temperature was elevated to 1,100° C. under a stream of hydrogen gas (carrier gas) and ammonia gas. Immediately after the substrate temperature had reached 1,100° C., the n-type contact layer 101 formed of GaN and having an Si concentration of $4.5\times10^{18}/cm^{-3}$ was deposited on the buffer layer 120 by using TMG and ammonia gas as raw material gases, and silane gas as an impurity gas (FIG. 2A).

Subsequently, the ESD layer 102 was formed through the following processes. Firstly, on the n-type contact layer 101 was deposited, through MOCVD, the first ESD layer 110 formed of undoped n-GaN and having a thickness of 50 nm to 500 nm. The growth temperature was adjusted to 800° C. to 950° C. so as to grow a high-quality crystal having a carrier concentration of $5\times10^{17}/cm^3$ or less and a pit density of $2\times10^8/m$ or more. When the growth temperature is adjusted to 800° C. to 900° C., a pit density is increased, which is preferred.

Figure 2B:
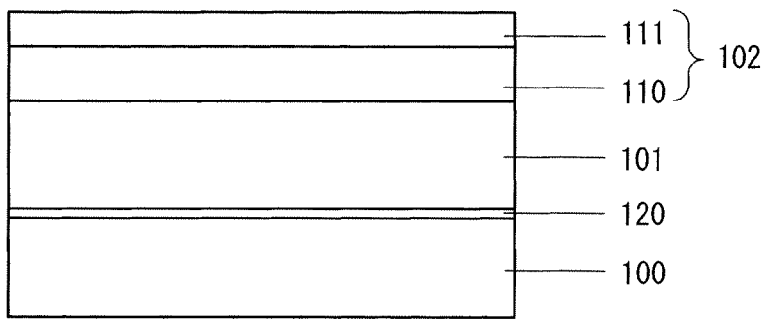
Figure 2C:
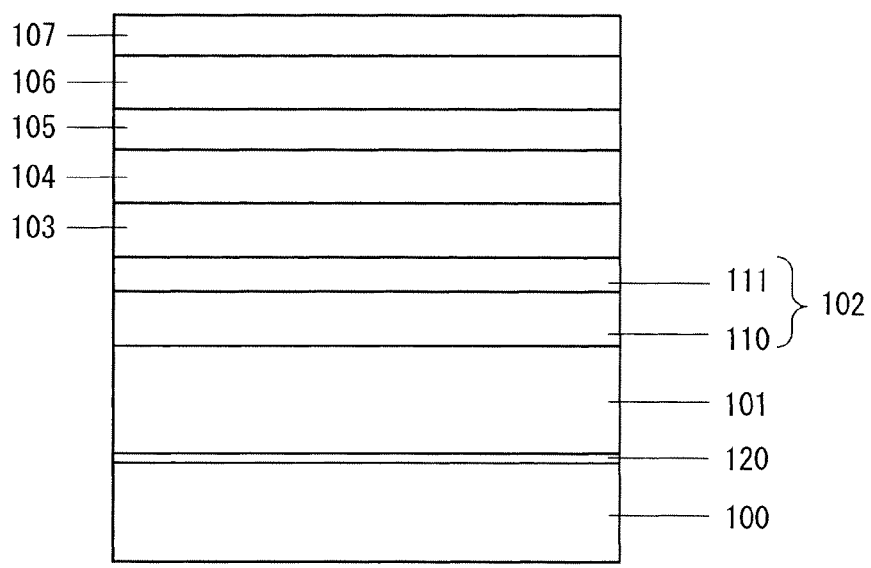

Next, on the first ESD layer 110 was deposited, through MOCVD, the second ESD layer 111 formed of n-GaN doped with Si and having a characteristic value, as defined by the product of Si concentration ($/cm^3$) and thickness (nm), of $0.9\times10^{20}$ to $3.6\times10^{20}$ (nm/$cm^3$). The growth temperature was adjusted to 800° C. to 950° C. Through these processes, the ESD layer 102 was formed on the n-type contact layer 101 (FIG. 2B).

Next, the n-type cladding layer 103 was formed on the ESD layer 102 through MOCVD. The n-type cladding layer 103 was formed by periodically stacking 15 layer units, each including the undoped $In_{0.08}Ga_{0.92}N$ layer 131 (thickness: 2.5 nm), the undoped GaN layer 132 (thickness: 0.7 nm), and the Si-doped n-GaN layer 133 (thickness: 1.4 nm). The $In_{0.08}Ga_{0.92}N$ layer 131 was formed under supply of silane gas, TMG, TMI, and ammonia while the substrate temperature was maintained at 830° C. The n-GaN layer 133 was formed under supply of TMG and ammonia while the substrate temperature was maintained at 830° C.

Then, the light-emitting layer 104 was formed on the n-type cladding layer 103. The light-emitting layer 104 was formed by periodically stacking seven layer units, each including the following four layers: the $Al_{0.05}Ga_{0.95}N$ layer 141, the $In_{0.2}Ga_{0.8}N$ layer 142, the GaN layer 143, and the $Al_wGa_{1-w}N$ layer 144. However, the $Al_wGa_{1-w}N$ layer 144 acting as a barrier layer 144 in the first block is two $Al_{0.33}Ga_{0.66}N$ layers 144. The $Al_wGa_{1-w}N$ layer 144 acting as a barrier layer 144 in the second block is three $Al_{0.2}Ga_{0.8}N$ layers 144. The $Al_wGa_{1-w}N$ layer 144 acting as a barrier layer 144 in the third block is two $Al_{0.07}Ga_{0.93}N$ layers 144. In this case, the growth temperature, i.e., the substrate temperature, of the $Al_wGa_{1-w}N$ layer 144 acting as a barrier layer 144 was any temperature from 800° C. to 950° C. The growth temperature of the $In_{0.2}Ga_{0.8}N$ layer 142, the GaN layer 143, and the $Al_{0.2}Ga_{0.8}N$ layer 144 was 770° C. Alternatively the growth temperature of the four layers 141, 142, 143, and 144 may be commonly maintained at 770° C. Each of the layers 141 to 144 was grown under supply of the corresponding raw material gases to form the light-emitting layer 104.

Subsequently, the undoped GaN layer 151 (thickness: 2.5 nm) was grown on the light-emitting layer 104 under supply of TMG and ammonia while the substrate temperature was maintained at 855° C. Then, while the substrate temperature was maintained at 855° C., the undoped $Al_{0.15}Ga_{0.85}N$ layer 152 (thickness: 3 nm) was grown under supply of TMA, TMG, and ammonia. Thus, the undoped cladding layer 105 was formed.

Next, the p-type cladding layer 106 was formed on the undoped cladding layer 105. The p-$In_{0.05}Ga_{0.95}N$ layer 161 (thickness: 1.7 nm) was formed under supply of $CP_2Mg$, TMI, TMG, and ammonia while the substrate temperature was maintained at 855° C., and the p-$Al_{0.3}Ga_{0.7}N$ layer 162 (thickness: 3.0 nm) was formed under supply of $CP_2Mg$, TMA, TMG, and ammonia while the substrate temperature was maintained at 855° C. This layer formation process was repeated seven times.

Then, while the substrate temperature was maintained at 1,000° C., the p-type contact layer 107 (thickness: 50 nm) formed of p-type GaN doped with Mg ($1\times10^{20}/cm^{-3}$) was deposited by use of TMG, ammonia, and $CP_2Mg$. Thus, the device structure shown in FIG. 2C was formed. The p-type contact layer 107 may have an Mg concentration of $1\times10^{19}/cm^{-3}$ to $1\times10^{21}/cm^{-3}$. The p-type contact layer 107 may have a thickness of 10 nm to 100 nm.

Subsequently, Mg was activated through thermal treatment, and then dry etching was performed from the top surface of the p-type contact layer 107, to thereby form a groove reaching the n-type contact layer 101. The p-electrode 108 was formed on the top surface of the p-type contact layer 107 from Ni/Au/Al (which were stacked in this order on the p-type contact layer 107). Then, on the surface of the n-type contact layer 101 exposed at the bottom of the groove through dry etching, the n-electrode 130 was formed from Ni/Au (which were stacked in this order on the n-type contact layer 101). Thus, the light-emitting device 1 shown in FIG. 1 was produced.

Figure 3:
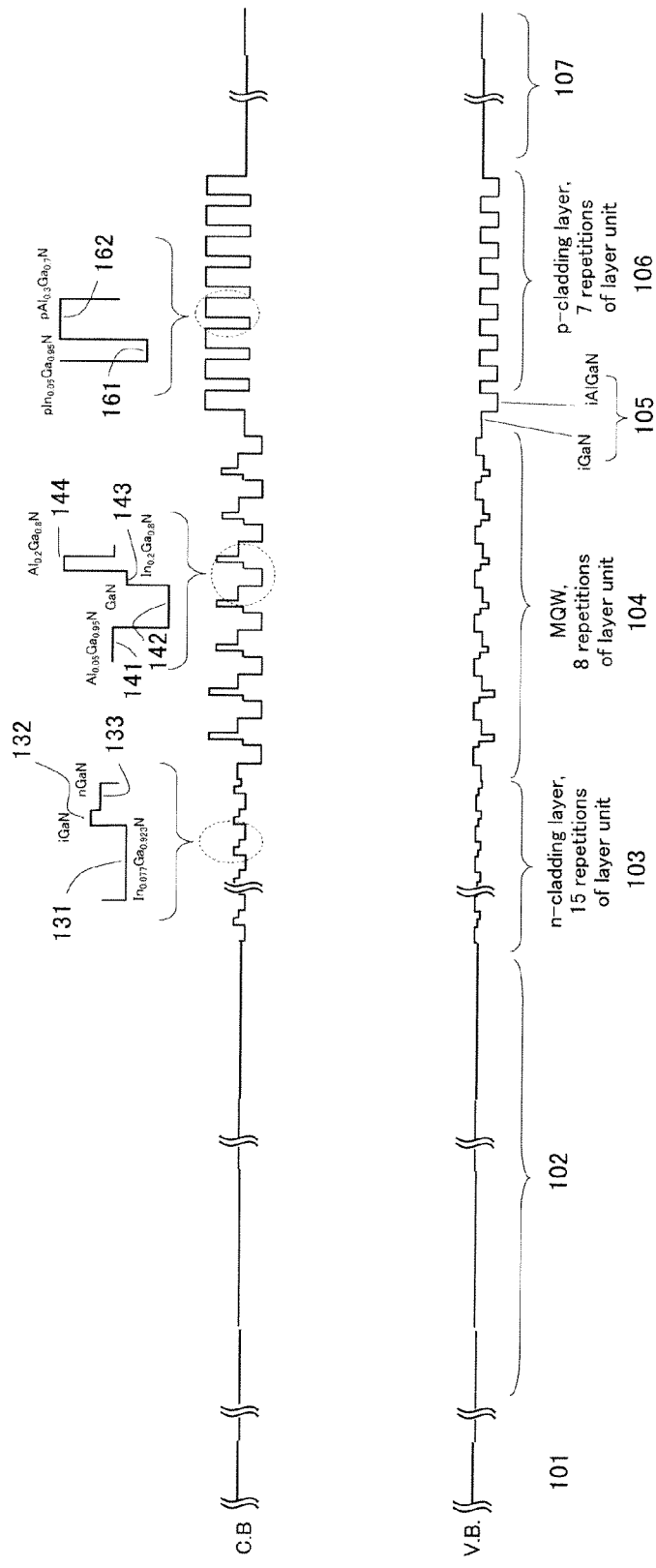
FIG. 3 shows the band structure of the light-emitting device according to Embodiment 1.

FIG. 3 shows the band structure of the light-emitting device 1. In the conduction band, the undoped GaN layer 132 of the n-type cladding layer 103 provides the highest potential barrier. However, since the GaN layer 132 has a thickness as small as 0.7 nm, electrons from the n-type contact layer 101 tunnel through the layer 132, and are injected into the light-emitting layer 104. Moreover, in the light-emitting layer 104, the Al composition ratio w of the $Al_wGa_{1-w}N$ layer 144 acting as a barrier layer 144 is higher in the barrier layer closer to the n-type cladding layer 103, and lower in the barrier layer closer to the p-type cladding layer 106. The Al composition ratio satisfies the relation x+z=2y, i.e., (x−y)=(y−z). This means that the deviation of the Al composition ratio of the barrier layer 144 in the first block from the Al composition ratio of the barrier layer 144 in the second block is equal to the deviation of the Al composition ratio of the barrier layer 144 in the second block relative from the Al composition ratio of the barrier layer 144 in the third block. In other words, the Al composition ratio distribution of the barrier layer 144 in the light-emitting layer 104 is point-symmetrical with respect to the second block.

Since a potential barrier is provided by addition of a p-type impurity between the light-emitting layer 104 and the p-type cladding layer 106, passage of electrons injected from the n-type cladding layer 103 into the light-emitting layer 104 is blocked by the p-$Al_{0.3}Ga_{0.7}N$ layer 162 of the p-type cladding layer 106. Therefore, electrons are effectively confined in the light-emitting layer 104. At this time, the Al composition ratio distribution of the barrier layer 144 is symmetrical in the thickness direction and the Al composition ratio is larger in the barrier layer closer to the n-type cladding layer 103 as mentioned above. Therefore, electrons can also be stored in the well layer 142 close to the n-type cladding layer 103.

Meanwhile, in the valence band, holes which are injected from the p-type contact layer 107, via the p-type cladding layer 106 and the undoped cladding layer 105, into the light-emitting layer 104 cannot tunnel through the undoped GaN layer 132 of the n-type cladding layer 103, although the GaN layer 132 has a thickness as small as 0.7 nm, which thickness is adequate to reflect holes. That is, passage of holes is blocked by the layer 132. Thus, holes are effectively confined in the light-emitting layer 104. Therefore, the hole density is uniformly distributed in the light-emitting layer 104. The density distribution of the recombination of electrons and holes in the light-emitting layer 104 can be more uniformed in the thickness direction. As a result, emission performance can be improved without increasing a driving voltage.

Figure 4:
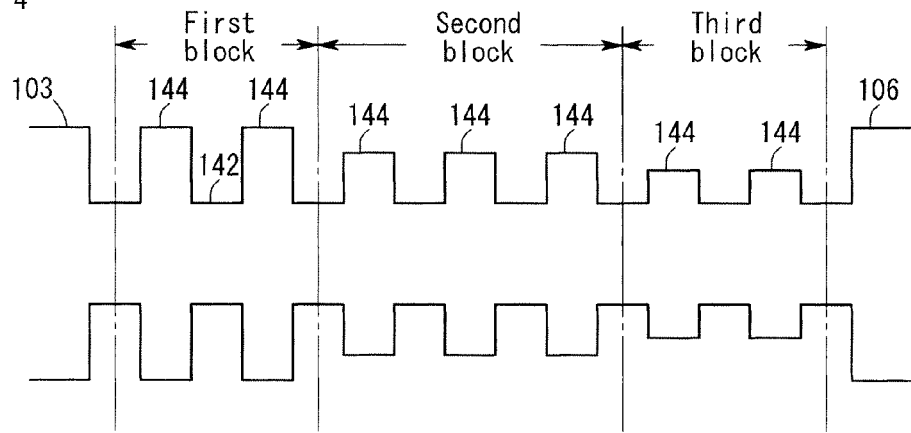
FIG. 4 shows the band structure simplified by focusing only on a barrier layer and a well layer in the light-emitting device according to Embodiment 1.

FIG. 4 shows the band structure focusing only on the barrier layer 144 having the above structure and the well layer 142. The potential barrier of the barrier layer 144 of the light-emitting layer 104 is higher on the n-type cladding layer 103 side and lower on the p-type cladding layer 106 side. Therefore, electrons injected into the well layer 142 in the first block of the light-emitting layer 104 are difficult to move to the well layer 142 in the second block due to the barrier height of the barrier layer 144 in the first block. Similarly, electrons of the well layer 142 in the second block are difficult to move to the well layer 142 in the third block due to the barrier height of the barrier layer 144 in the second block. As a result, in the light-emitting layer 104, the electron density of the well layer 142 is higher on the n-type cladding layer 103 side than on the p-type cladding layer 106 side. Thus, a part of holes which are injected from the p-type cladding layer 106 into the light-emitting layer 104 reaches the layer in the light-emitting layer 104, which layer is contacted with the n-type cladding layer 103, and recombines with electrons at that part as well. Therefore, the emitted light is uniformed in the thickness direction of the light-emitting layer 104, resulting in improvement of emission output and performance.

Embodiment 2

Figure 5:
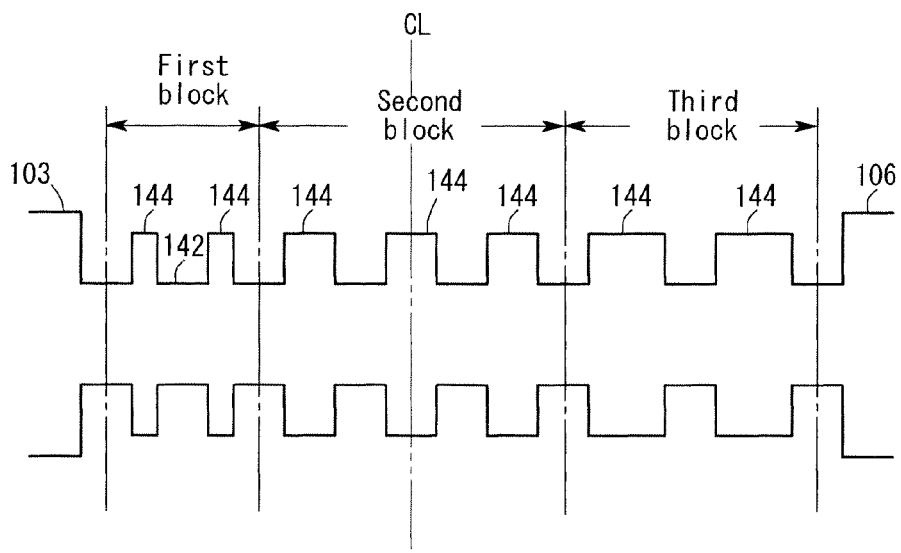
FIG. 5 shows the band structure simplified by focusing only on a barrier layer and a well layer in a light-emitting device according to Embodiment 2.

In Embodiment 2, the thickness of the barrier layer 144 in the light-emitting layer 104 is changed. The Al composition ratios w of seven $Al_wGa_{1-w}N$ layers 144 acting as a barrier layer 144 are all 0.2. Two barrier layers in the first block have a thickness a of 0.48 nm. Three barrier layers in the second block have a thickness b of 0.6 nm. Two barrier layers in the third block have a thickness c of 0.72 nm. In other words, the thickness a of the barrier layer 144 in the first block, the thickness b of the barrier layer 144 in the second block, and the thickness c of the barrier layer 144 in the third block satisfy the relation a+c=2b, i.e., (b−a)=(c−b)=0.12 nm. That is, the deviations from the thickness of the barrier layer 144 in the second block are point-symmetrical with respect to the thickness of the barrier layer 144 in the second block. In this case, the thickness c of the barrier layer 144 closer to the p-type cladding layer 106 is larger than the thickness a of the barrier layer 144 closer to the n-type cladding layer 103, that is, the relation a<c is satisfied. The light-emitting device according to Embodiment 2 was produced having the same configuration as the light-emitting device according to Embodiment 1, except for the thickness and Al composition ratio of the barrier layer. FIG. 5 shows the band structure simplified by extracting only the barrier layer 144 and the well layer 142 of the light-emitting layer 104.

Embodiment 3

In Embodiment 3, the thickness of the barrier layer 144 of the light-emitting layer 104 is changed as in Embodiment 2.

Figure 6:
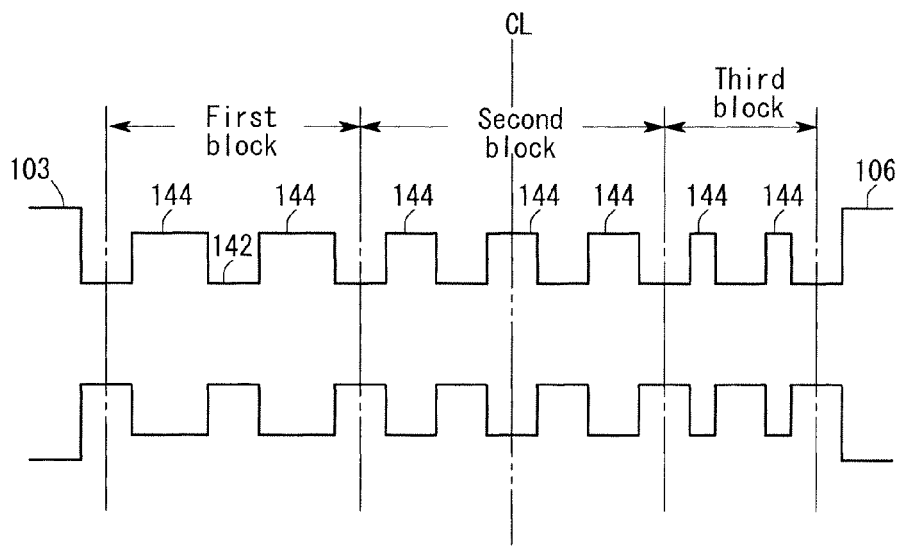
FIG. 6 shows the band structure simplified by focusing only on a barrier layer and a well layer in a light-emitting device according to Embodiment 3.

The Al composition ratios w of seven $Al_wGa_{1-w}N$ layers 144 acting as a barrier layer 144 are all 0.2. Two barrier layer layers in the first block have a thickness a of 0.72 nm. Three barrier layers in the second block have a thickness b of 0.6 nm. Two barrier layers in the third block have a thickness c of 0.48 nm. In other words, the thickness a of the barrier layer 144 in the first block, the thickness b of the barrier layer 144 in the second block, and the thickness c of the barrier layer 144 in the third block satisfy the relation a+c=2b, i.e., (a−b)=(b−c)= 0.12 nm. That is, the deviations from the thickness of the barrier layer 144 in the second block are point-symmetrical with respect to the thickness of the barrier layer 144 in the second block. In this case, contrary to Embodiment 2, in Embodiment 3, the thickness c of the barrier layer 144 closer to the p-type cladding layer 106 is smaller than the thickness a of the barrier layer 144 closer to the n-type cladding layer 103, that is, the relation c<a is satisfied. The light-emitting device according to Embodiment 3 was produced having the same configuration as the light-emitting device according to Embodiment 1, except for the thickness and Al composition ratio of the barrier layer. FIG. 6 shows the band structure simplified by extracting only the barrier layer 144 and the well layer 142 of the light-emitting layer 104.

If the thickness distribution of the barrier layer 144 is point-symmetrical with respect to the center CL of the thickness of the light-emitting layer 104 as shown in FIGS. 5 and 6, the emission intensity is higher as compared to the case where it is not symmetrical. Such thickness distribution of the barrier layer 144 enables a uniform emission intensity in the thickness direction of the light-emitting layer 104, resulting in increase of emission intensity.

Embodiment 4

In Embodiment 4, the barrier layer 144 has the same Al composition ratio distribution as in Embodiment 1 and has the same thickness distribution as in Embodiment 2. The barrier layer 144 in the first block of the light-emitting layer 104 is two $Al_{0.33}Ga_{0.66}N$ layers 144 having a thickness of 0.48 nm. The barrier layer 144 in the second block of the light-emitting layer 104 is three $Al_{0.2}Ga_{0.8}N$ layers 144 having a thickness of 0.6 nm. The barrier layer 144 in the third block of the light-emitting layer 104 is two $Al_{0.07}Ga_{0.93}N$ layers 144 having a thickness of 0.72 nm. In other words, the Al composition ratio satisfies the relations x+z=2y and z<x, and the thickness satisfies the relations a+c=2b and a<c. With this configuration, since the barrier layer 144 closer to the n-type cladding layer 103 has a larger Al composition ratio, the barrier for electrons is higher in the barrier layer closer to the n-type cladding layer 103 and the barrier for electrons is lower in the barrier layer closer to the p-type cladding layer 106. To suppress the overflow of electrons due to the lower barrier height of the barrier layer 144 closer to the p-type cladding layer 106, the barrier layer 144 closer to the p-type cladding layer 106 has a larger thickness, resulting in increase of emission intensity.

In the all above-described embodiments, the light-emitting layer 104 may have any number of barrier layers 144 if the number of layers in the first block is equal to the number of layers in the third block. The barrier layer 144 may have any Al composition ratio if the relations x+z=2y and z<x are satisfied, but the emission intensity is high when the relation is $1.1 \leq x/y \leq 2.2$. When x/y is smaller than 1.1, the effect of uniforming electron density distribution in the well layers by changing the Al composition ratio in the light-emitting layer 104 is reduced, which is not preferable. When x/y is larger than 2.2, the crystallinity of the well layer is reduced, which is not preferable. Therefore, x/y is preferably within the above range.

Additionally, if the thickness of the barrier layer 144 satisfies the relation a+c=2b, any range of thickness may be possible. However, when a/b is $0.7 \leq a/b \leq 0.9$, the emission intensity is increased. When the thickness of barrier layer 144 closer to the p-type cladding layer 106 is larger than the thickness of the barrier layer 144 closer to the n-type cladding layer 103, the emission intensity is higher than the opposite case. In both cases, the emission intensity is higher than the case where the barrier layer has a constant thickness. When a/b exceeds 0.9, a variation in the width of the barrier layer 144 is reduced, and the effect of confining electrons with an uniform density in the thickness direction of the light-emitting layer is reduced, which is not preferred. When a/b is smaller than 0.7, less electrons move to the well layer over the barrier layer having a large thickness, resulting in an obstacle to uniform light-emitting region in the thickness direction of the light-emitting layer. Therefore, a/b is preferably within the above range.

Embodiment 5

The present embodiment is the same as Embodiment 1 except for that the barrier layer of the light-emitting layer 104, the Al composition ratio of which is varied, is changed to the barrier layer 141 from the barrier layer 144. As in Embodiment 1, the light-emitting layer 104 is divided into three blocks of the first block, the second block, and the third block in the thickness direction from the n-type-layer-side cladding layer 103. In the first block, two layer units are provided, each including sequentially stacked four layers: an $Al_{0.083}Ga_{0.917}N$ layer 141 (thickness: 2.4 nm), an $In_{0.2}Ga_{0.8}N$ layer 142 (thickness: 3.2 nm), a GaN layer 143 (thickness: 0.6 nm), and an $Al_{0.2}Ga_{0.8}N$ layer 144 (thickness: 0.6 nm). In the second block, three layer units are provided, each including sequentially stacked four layers: an $Al_{0.05}Ga_{0.95}N$ layer 141 (thickness: 2.4 nm), an $In_{0.2}Ga_{0.8}N$ layer 142 (thickness: 3.2 nm), a GaN layer 143 (thickness: 0.6 nm), and an $Al_{0.2}Ga_{0.8}N$ layer 144 (thickness: 0.6 nm). In the third block, two layer units are provided, each including sequentially stacked four layers: an $Al_{0.017}Ga_{0.983}N$ layer 141 (thickness: 2.4 nm), an $In_{0.2}Ga_{0.8}N$ layer 142 (thickness: 3.2 nm), a GaN layer 143 (thickness: 0.6 nm), and an $Al_{0.2}Ga_{0.8}N$ layer 144 (thickness: 0.6 nm). Two $Al_{0.083}Ga_{0.917}N$ layers 141 in the first block, three $Al_{0.05}Ga_{0.95}N$ layers 141 in the second block, and two $Al_{0.017}Ga_{0.983}N$ layers 141 in the third block are respectively a barrier layer 141 of the present invention. The $In_{0.2}Ga_{0.8}N$ layers 142 are a well layer 142. Hereinafter, the reference numerals 141 and 142 are also assigned to a barrier layer and a well layer, respectively.

The initial layer of the light-emitting layer 104, which is in contact with the n-type cladding layer 103, is the $Al_{0.083}Ga_{0.917}N$ layer 141, and the final layer of the light-emitting layer 104, which is in contact with the undoped cladding layer 105, is the $Al_{0.2}Ga_{0.8}N$ layer 144. The thickness of one layer unit is 6.8 nm. The overall thickness of the light-emitting layer 104 is 47.6 nm. All the layers of the light-emitting layer 104 are formed of undoped layers. Layers other than the light-emitting layer 104 have the same configuration and are produced by the same production method as in Embodiment 1.

However, in the method for producing the light-emitting layer 104, the $Al_wGa_{1-w}N$ layer 141 acting as a barrier layer 141 in the first block is two $Al_{0.083}Ga_{0.917}N$ layers 141 having a thickness of 2.4 nm. The $Al_wGa_{1-x}N$ layer 141 acting as a barrier layer 141 in the second block is three $Al_{0.05}Ga_{0.95}N$ layers 141 having a thickness of 2.4 nm. The $Al_wGa_{1-w}N$ layer 141 acting as a barrier layer 141 in the third block is two $Al_{0.017}Ga_{0.983}N$ layers 141 having a thickness of 2.4 nm. The growth temperature of the $Al_wGa_{1-w}N$ layer 141 acting as a barrier layer 141 was any temperature from 800° C. to 950° C. The growth temperature of the $In_{0.2}Ga_{0.08}N$ layer 142, the GaN layer 143, and the $Al_{0.2}Ga_{0.8}N$ layer 144 was 770° C. Alternatively, the growth temperature of the four layers 141, 142, 143, and 144 may be commonly maintained at 770° C. Each of the layers 141 to 144 was grown under supply of the corresponding raw material gases to form the light-emitting layer 104.

Figure 7:
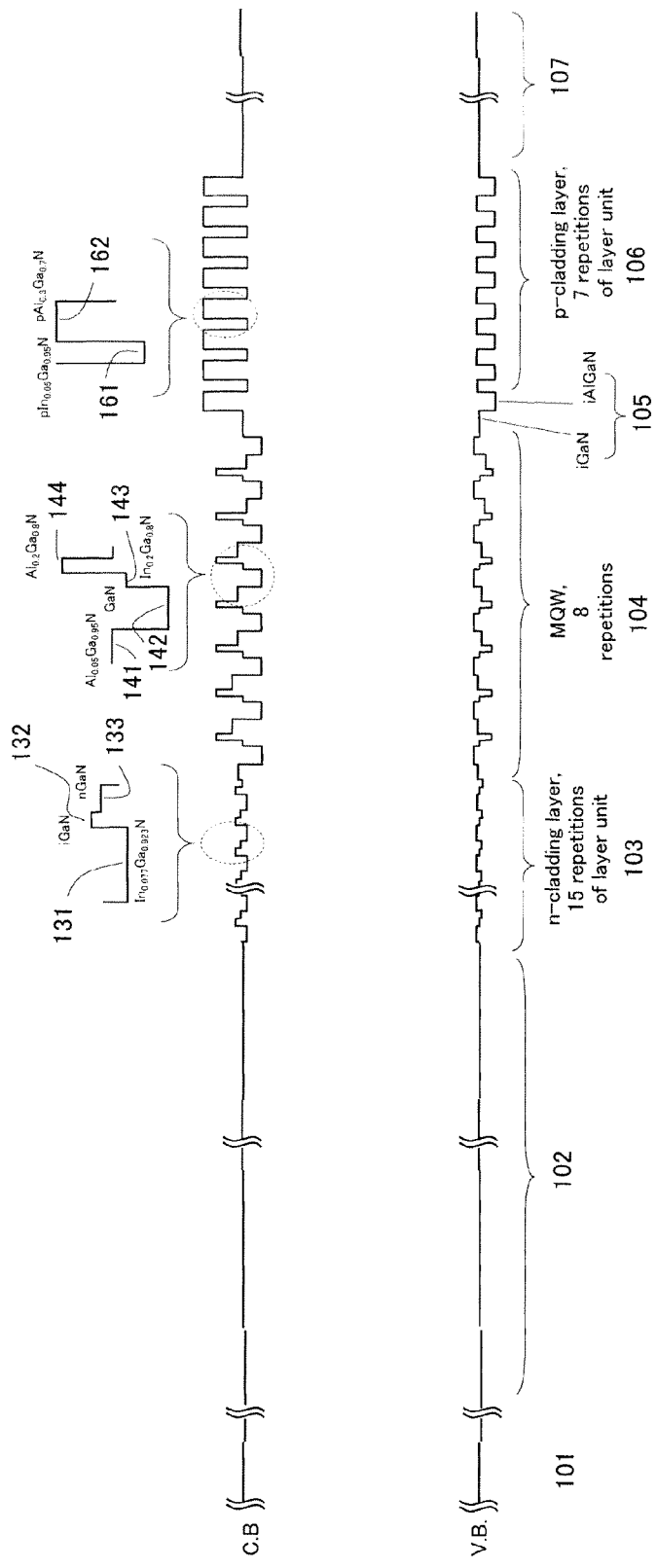
FIG. 7 shows the band structure of a light-emitting device according to Embodiment 5.

FIG. 7 shows the band structure of the light-emitting device 1. In the conduction band, the undoped GaN layer 132 of the n-type cladding layer 103 provides the highest potential barrier. However, since the GaN layer 132 has a thickness as small as 0.7 nm, electrons from the n-type contact layer 101 tunnel through the layer 132, and are injected into the light-emitting layer 104. Moreover, in the light-emitting layer 104, the Al composition ratio w of the $Al_wGa_{1-w}N$ layer 141 acting as a barrier layer 141 is higher in the barrier layer closer to the n-type cladding layer 103, and lower in the barrier layer closer to the p-type cladding layer 106. The Al composition ratio satisfies the relation x+z=2y, i.e., (x−y)=(y−z). This means that the deviation of the Al composition ratio of the barrier layer 141 in the first block from the Al composition ratio of the barrier layer 141 in the second block is equal to the deviation of the Al composition ratio of the barrier layer 141 in the second block from the Al composition ratio of the barrier layer 141 in the third block. In other words, the Al composition ratio distribution of the barrier layer 141 in the light-emitting layer 104 is point-symmetrical with respect to the second block.

Since a potential barrier is provided by addition of a p-type impurity between the light-emitting layer 104 and the p-type cladding layer 106, passage of electrons injected from the n-type cladding layer 103 into the light-emitting layer 104 is blocked by the p-$Al_{0.3}Ga_{0.7}N$ layer 162 of the p-type cladding layer 106. Therefore, electrons are effectively confined in the light-emitting layer 104. At this time, the Al composition ratio distribution of the barrier layer 141 is symmetrical in the thickness direction and the Al composition ratio is larger in the barrier layer closer to the n-type cladding layer 103 as mentioned above. Therefore, electrons can also be stored in the well layer 142 close to the n-type cladding layer 103.

Meanwhile, in the valence band, holes which are injected from the p-type contact layer 107, via the p-type cladding layer 106 and the undoped cladding layer 105, into the light-emitting layer 104 cannot tunnel through the undoped GaN layer 132 of the n-type cladding layer 103, although the GaN layer 132 has a thickness as small as 0.7 nm, which thickness is adequate to reflect holes. That is, passage of holes is blocked by the layer 132. Thus, holes are effectively confined in the light-emitting layer 104. Therefore, the hole density is uniformly distributed in the light-emitting layer 104. The density distribution of the recombination of electrons and holes in the light-emitting layer 104 can be more uniformed in the thickness direction. As a result, emission performance can be improved without increasing driving voltage.

Figure 8:
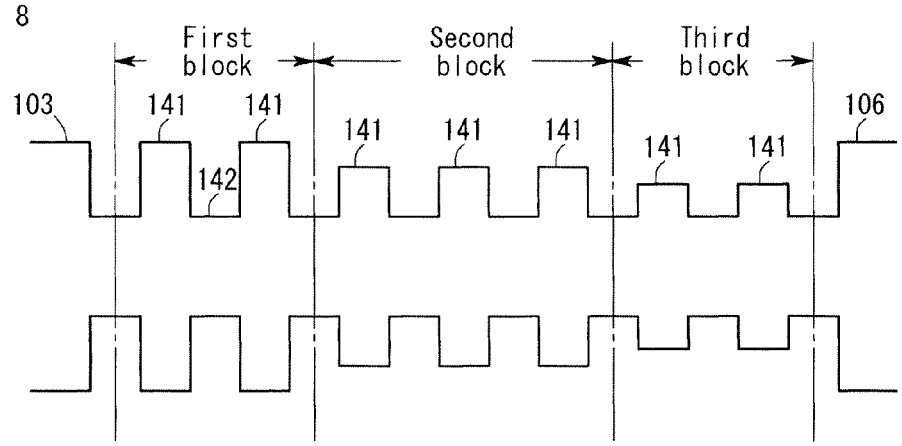
FIG. 8 shows the band structure simplified by focusing only on a barrier layer and a well layer in the light-emitting device according to Embodiment 5.

FIG. 8 shows the band structure focusing only on the barrier layer 141 having the above structure and the well layer 142. The potential barrier of the barrier layer 141 in the light-emitting layer 104 is higher on the n-type cladding layer 103 side and lower on the p-type cladding layer 106 side. Therefore, electrons injected into the well layer 142 in the first block of the light-emitting layer 104 are difficult to move to the well layer 142 in the second block due to the barrier height of the barrier layer 141 in the first block. Similarly, electrons injected into the well layer 142 in the second block are difficult to move to the well layer 142 in the third block due to the barrier height of the barrier layer 141 in the second block. As a result, in the light-emitting layer 104, the electron density of the well layer 142 is higher on the n-type cladding layer 103 side than on the p-type cladding layer 106 side. Thus, a part of holes which are injected from the p-type cladding layer 106 into the light-emitting layer 104 reaches the layer in the light-emitting layer 104, which layer is contacted with the n-type cladding layer 103, and recombines with electrons at that part as well. Therefore, the emitted light is uniformed in the thickness direction of the light-emitting layer 104, resulting in improvement of emission output and performance.

Figure 11:
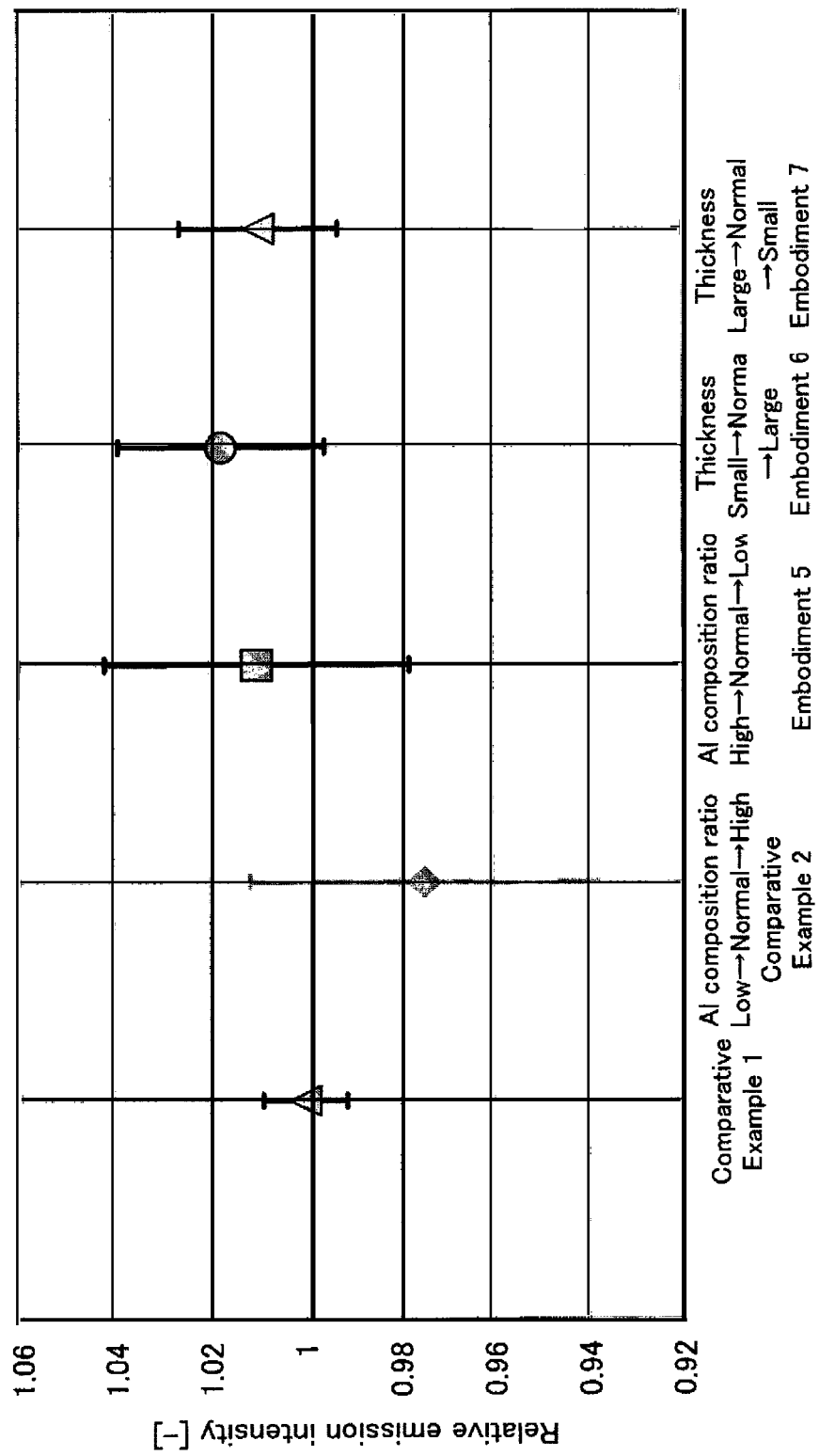
FIG. 11 is a chart showing the emission intensity of the light-emitting layers according to Embodiments 5, 6, 7 and Comparative Examples 1 and 2.

FIG. 11 is a chart showing the measured emission intensity from the light-emitting layers. A light-emitting device was produced as Comparative Example 1, in which the light-emitting layer 104 has the aforementioned seven layer units, and the Al composition ratios w of seven $Al_wGa_{1-w}N$ layers 141 acting as a barrier layer are all 0.05, the same as the Al composition ratio of the barrier layer in the second block according to Embodiment 5. Moreover, a light-emitting device was produced as Comparative Example 2, in which the Al composition ratio w of the $Al_wGa_{1-w}N$ layers 141 acting as a barrier layer is 0.017 in the first block, 0.05 in the second block, and 0.083 in the third block. In Comparison Example 2, although the Al composition ratio distribution of the barrier layer 141 of the light-emitting layer 104 is point-symmetrical with respect to the center of the thickness of the light-emitting layer 104, the Al composition ratio w is lower in the barrier layer closer to the n-type cladding layer 103 and higher in the barrier layer closer to the p-type cladding layer 106. FIG. 11 shows the relative emission intensity when the emission intensity of the light emitting layer according to Comparative Example 1 is normalized to 1. As is understood from FIG. 11, the emission intensity is as small as 0.975 in Comparative Example 2, and as large as 1.01 in Embodiment 5. Therefore, the emission intensity is higher in the point-symmetry and distribution of the Al composition ratio in the barrier layer 141 according to Embodiment 5, as compared to the uniform distribution (Comparative Example 1) or the distribution opposite to that of Embodiment 5 (Comparative Example 2).

In Embodiment 1, the Al composition ratio of the barrier layer 144 is changed in the same manner, instead of that of the barrier layer 141 in Embodiment 5. However, both layers 141 and 144 have a larger bandgap than that of the well layer 142, and act as a barrier layer to confine carriers in the well layer 142. Therefore, from the measurement results of FIG. 11, it is considered that the same effect as in Embodiment 5 can be obtained in Embodiment 1.

Embodiment 6

Figure 9:
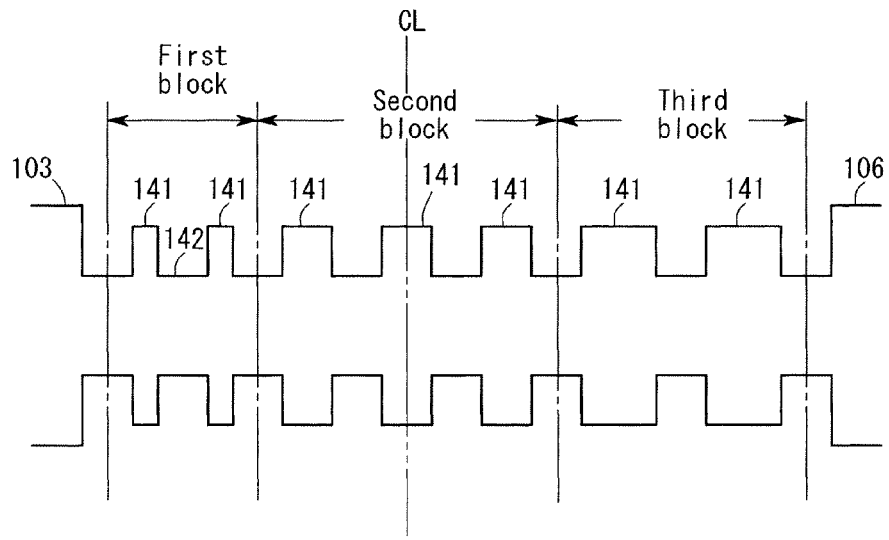
FIG. 9 shows the band structure simplified by focusing only on a barrier layer and a well layer in a light-emitting device according to Embodiment 6.

In Embodiment 6, the thickness of the barrier layer 141 in the light-emitting layer 104 is changed. The Al composition ratio w of seven $Al_wGa_{1-w}N$ layers 141 acting as a barrier layer are all 0.05. Two barrier layers 141 in the first block have a thickness a of 2.0 nm. Three barrier layers in the second block have a thickness b of 2.4 nm. Two barrier layers in the third block have a thickness c of 2.8 nm. In other words, the thickness a of the barrier layer 141 in the first block, the thickness b of the barrier layer 141 in the second block, and the thickness c of the barrier layer 141 in the third block satisfy the relation a+c=2b, i.e., (b−a)=(c−b)=0.4 nm. That is, the deviations from the thickness of the barrier layer 141 in the second block are symmetrical with respect to the thickness of the barrier layer 141 in the second block. In this case, the thickness c of the barrier layer 141 closer to the p-type cladding layer 106 is larger than the thickness a of the barrier layer 141 closer to the n-type cladding layer 103, that is, the relation a<c is satisfied. The light-emitting device according to Embodiment 6 was produced having the same configuration as the light-emitting device according to Embodiment 5, except for the thickness and Al composition ratio of the barrier layer 141. FIG. 9 shows the band structure simplified by extracting only the barrier layer 141 and the well layer 142 of the light-emitting layer 104.

FIG. 11 shows the measured emission intensity. It is clear that the emission intensity of the light-emitting device according to Embodiment 6 is 1.018 which is larger than that of Comparative Example 1. Similarly, from the measurement results of FIG. 11, it is considered that the same effect can be achieved when the barrier layer 144 according to Embodiment 2 has the same thickness distribution as in Embodiment 6.

Embodiment 7

Figure 10:
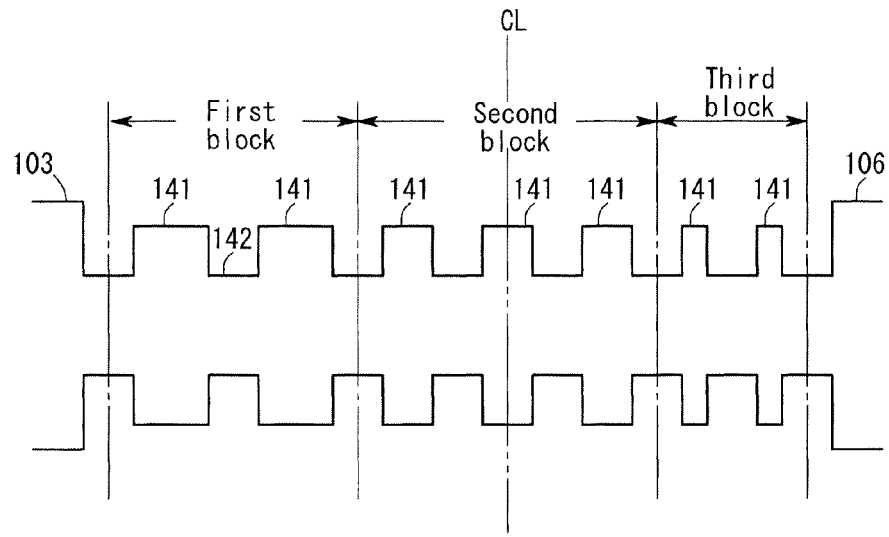
FIG. 10 shows the band structure simplified by focusing only on a barrier layer and a well layer in a light-emitting device according to Embodiment 7.

In Embodiment 7, the thickness of the barrier layer 141 of the light-emitting layer 104 is changed in the same manner as in Embodiment 6. The Al composition ratio w of seven $Al_wGa_{1-x}N$ layers 141 acting as a barrier layer are all 0.05. Two barrier layers in the first block have a thickness a of 2.8 nm. Three barrier layers in the second block have a thickness b of 2.4 nm. Two barrier layers in the third block have a thickness c of 2.0 nm. In other words, the thickness a of the barrier layer 141 in the first block, the thickness b of the barrier layer 141 in the second block, and the thickness c of the barrier layer 141 in the third block satisfy the relation a+c=2b, i.e., (a−b)=(b−c)=0.4 nm. That is, the deviations from the thickness of the barrier layer 141 in the second block are point-symmetrical with respect to the thickness of the barrier layer 141 in the second block. In this case, contrary to Embodiment 6, the thickness c of the barrier layer 141 closer to the p-type cladding layer 106 is smaller than the thickness a of the barrier layer 141 closer to the n-type cladding layer 103, that is, the relation c<a is satisfied. The light-emitting device according to Embodiment 7 was produced having the same configuration as the light-emitting device according to Embodiment 5, except for the thickness and Al composition ratio of the barrier layer 141. FIG. 10 shows the band structure simplified by extracting only the barrier layer 141 and the well layer 142 of the light-emitting layer 104.

FIG. 11 shows the measured emission intensity. It is clear that the emission intensity of the light-emitting device according to Embodiment 7 is 1.01 which is larger than that of Comparison Example 1. Similarly, from the measurement results of FIG. 11, it is considered that the same effect can be achieved when the barrier layer 144 according to Embodiment 3 has the similar thickness distribution as in Embodiment 7.

It is obvious from the above that if the thickness distribution of the barrier layer 141 is point-symmetrical with respect to the center CL of the thickness of the light-emitting layer 104 as shown in FIGS. 9 and 10, the emission intensity is higher as compared to the case where it is not symmetrical (Comparison Example 1). Such thickness distribution of the barrier layer 141 enables a uniform emission intensity in the thickness direction of the light-emitting layer 104, resulting in increase of emission intensity.

Embodiment 8

In Embodiment 8, the barrier layer 141 has the same Al composition ratio distribution as in Embodiment 5 and the same thickness distribution as in Embodiment 6. The barrier layer 141 in the first block of the light-emitting layer 104 is two $Al_{0.083}Ga_{0.917}N$ layers 141 having a thickness of 2.0 nm. The barrier layer 141 in the second block of the light-emitting layer 104 is three $Al_{0.05}Ga_{0.95}N$ layers 141 having a thickness of 2.4 nm. The barrier layer 141 in the third block of the light-emitting layer 104 is two $Al_{0.017}Ga_{0.983}N$ layers 141 having a thickness of 2.8 nm. In other words, the composition ratio satisfies the relations x+z=2y and z<x, and the thickness satisfies the relations a+c=2b and a<c. With this configuration, since the barrier layer 141 closer to the n-type cladding layer 103 has a larger Al composition ratio, the barrier for electrons is higher in the barrier layer closer to the n-type cladding layer 103 and the barrier for electrons is lower in the barrier layer closer to the p-type cladding layer 106. To suppress the overflow of electrons due to the lower barrier height of the barrier layer 141 closer to the p-type cladding layer 106, the thickness is larger in the barrier layer 141 closer to the p-type cladding layer 106, resulting in higher emission intensity.

In the above-described embodiments 5 to 8, the light-emitting layer 104 may have any number of barrier layers 141 if the number of layers in the first block is equal to the number of layers in the third block. Although the barrier layer 141 may have any Al composition ratio if the relations x+z=2y and z<x are satisfied, the emission intensity is high when the relation is $1.1 \le x/y \le 2.2$. When x/y is smaller than 1.1, the effect of uniforming electron density distribution in the well layer by changing the Al composition ratio in the light-emitting layer 104 is reduced, which is not preferable. When x/y is larger than 2.2, the crystallinity of the well layer is reduced, which is not preferable. Therefore, x/y is preferably within the above range.

Additionally, if the thickness of the barrier layer 141 satisfies the relation a+c=2b, any range of thickness may be possible. However, when a/b is $0.7 \le a/b \le 0.9$, the emission intensity is increased. When the thickness of barrier layer 141 closer to the p-type cladding layer 106 is larger than the thickness of the barrier layer 141 closer to the n-type cladding layer 103, the emission intensity is higher than the opposite case. In both cases, the emission intensity is higher than the case where the barrier layer has a constant thickness. When a/b exceeds 0.9, a variation in the width of the barrier layer 141 is reduced, and the effect of confining electrons with an uniform density in the thickness direction of the light-emitting layer is reduced, which is not preferred. When a/b is smaller than 0.7, less electrons move to the well layer over the barrier layer having a large thickness, resulting in an obstacle to uniform light-emitting region in the thickness direction of the light-emitting layer. Therefore, a/b is preferably within the above range.

In the above-described embodiments 1 to 8, the n-type cladding layer 103 has a periodic structure including the undoped $In_{0.08}Ga_{0.92}N$ layer 131, the undoped GaN layer 132, and the Si-doped n-GaN layer 133, which are stacked in this order on the n-type contact layer 101. However, the n-type cladding layer 103 may have a periodic structure in which the $In_{0.08}Ga_{0.92}N$ layer, the Si-doped n-GaN layer, and the undoped GaN layer are stacked in this order; the Si-doped n-GaN layer, the undoped GaN layer, and the $In_{0.08}Ga_{0.92}N$ layer are stacked in this order; or the Si-doped n-GaN layer, the $In_{0.08}Ga_{0.92}N$ layer, and the undoped GaN layer are stacked in this order. The $In_{0.08}Ga_{0.92}N$ layer 131 may be doped with Si, so as to serve as an n-type layer. The GaN layer 133 may be undoped. The $Al_{0.2}Ga_{0.8}N$ layer 133 doped with Si may be used instead of the Si-doped n-GaN layer 133. The $Al_{0.2}Ga_{0.8}N$ layer 133 may be undoped.

The n-type cladding layer 103 is formed of 15 layer units, but the number of layer units is not limited thereto. For example, the number of layer units may be 3 to 30. The undoped GaN layer 132 may have a thickness of 0.3 nm to 2.5 nm. The Si-doped GaN layer 133 may have a thickness of 0.3 nm to 2.5 nm. The $In_{0.08}Ga_{0.92}N$ layer 131 may have a thickness of 1.5 nm to 5.0 nm.

When the $Al_xGa_{1-x}N$ layer 132 is used as the layer 132, the $Al_xGa_{1-x}N$ layer 132 may have an composition ratio x of 0.05 to 1. The composition ratio x is preferably 0.1 to 0.8, more preferably 0.2 to 0.6. In the case where the $Al_xGa_{1-x}N$ layer 132 is formed of AlN, even when the layer has a thickness as small as 0.3 nm, electrons can tunnel through the layer, and passage of holes can be blocked by the layer. Meanwhile, in the case where the $Al_xGa_{1-x}N$ layer 132 is formed of $Al_{0.05}Ga_{0.95}N$, the layer 132 must have a thickness as large as 2.5 nm. Thus, the $Al_xGa_{1-x}N$ layer 132 may have a thickness of 0.3 nm to 2.5 nm. Since one of the layers forming the periodic structure of the p-type cladding layer 106 is the p-$Al_{0.3}Ga_{0.7}N$ layer 162, the Al composition ratio x of the $Al_xGa_{1-x}N$ layer 132 of the n-type cladding layer 103 is preferably adjusted to 0.15 or more.

The Group III nitride semiconductor light-emitting device of the present invention exhibits improved emission performance without increasing driving voltage.

What is claimed is:

1. A Group III nitride semiconductor light-emitting device comprising:
   at least an n-type-layer-side cladding layer;
      a light-emitting layer comprising a multiple quantum structure comprising a plurality of layer units, each unit comprising at least a well layer, a first barrier layer comprising $Al_{x1}Ga_{1-x1}N$ (0<x1<1), and a second barrier layer comprising $Al_{x2}Ga_{1-x2}N$ (0<x2<1) with an Al composition ratio x2 which is more than an Al composition ratio x1 of the first barrier layer; and
   a p-type-layer-side cladding layer, each of the n-type-layer-side cladding layer, the light-emitting layer, and the p-type-layer-side cladding layer comprising a Group III nitride semiconductor,
   wherein, the light-emitting layer comprises a first block, a second block, and a third block in a thickness direction from the n-type-layer-side cladding layer to the p-type-layer-side cladding layer, an Al composition ratio of a selected barrier layer which is at least one of the first barrier layer and the second barrier layer in each block is set to satisfy a relation z<y<x where an average Al composition ratio of the selected barrier layer(s) in the first block is represented as x, an average Al composition ratio of the selected barrier layer(s) in the second block is represented as y, and an average Al composition ratio of the selected barrier layer(s) in the third block is represented as z.

2. A Group III nitride semiconductor light-emitting device according to claim 1, wherein a number of the selected barrier layer(s) in the first block is equal to a number of the selected barrier layer(s) in the third block, and the average Al composition ratio of the selected barrier layer(s) in each block is set so as to satisfy a relation x+z=2y.

3. A Group III nitride semiconductor light-emitting device according to claim 2, wherein a ratio x/y is set so as to satisfy a relation $1.1 \leq x/y \leq 2.2$.

4. A Group III nitride semiconductor light-emitting device according to claim 1, wherein a thickness of the selected barrier layer(s) in each block is set so as to satisfy at least one of relations a<b<c and c<b<a when an average thickness of the selected barrier layer(s) in the first block is represented as a, an average thickness of the selected barrier layer(s) in the second block as b, and an average thickness of the selected barrier layer(s) in the third block as c.

5. A Group III nitride semiconductor light-emitting device according to claim 2, wherein a thickness of the selected barrier layer(s) in each block is set so as to satisfy at least one of relations a<b<c and c<b<a when an average thickness of the selected barrier layer(s) in the first block is represented as a, an average thickness of the selected barrier layer(s) in the second block as b, and an average thickness of the selected barrier layer(s) in the third block as c.

6. A Group III nitride semiconductor light-emitting device according to claim 3, wherein a thickness of the selected barrier layer(s) in each block is set so as to satisfy at least one of relations a<b<c and c<b<a when an average thickness of the selected barrier layer(s) in the first block is represented as a, an average thickness of the selected barrier layer(s) in the second block as b, and an average thickness of the selected barrier layer(s) in the third block as c.

7. A Group III nitride semiconductor light-emitting device according to claim 4, wherein a number of the selected barrier layer(s) in the first block is equal to a number of the selected barrier layer(s) in the third block, and the thickness of the selected barrier layer(s) in each block is set to satisfy a relation a+c=2b.

8. A Group III nitride semiconductor light-emitting device according to claim 5, wherein a number of the selected barrier layer(s) in the first block is equal to a number of the selected barrier layer(s) in the third block, and the thickness of the selected barrier layer(s) in each block is set to satisfy a relation a+c=2b.

9. A Group III nitride semiconductor light-emitting device according to claim 6, wherein a number of the selected barrier layer(s) in the first block is equal to a number of the selected barrier layer(s) in the third block, and the thickness of the selected barrier layer(s) in each block is set to satisfy a relation a+c=2b.

10. A Group III nitride semiconductor light-emitting device according to claim 7, wherein the thickness of the selected barrier layer(s) in each block is set to satisfy a relation a<c.

11. A Group III nitride semiconductor light-emitting device according to claim 8, wherein the thickness of the selected barrier layer(s) in each block is set to satisfy a relation a<c.

12. A Group III nitride semiconductor light-emitting device according to claim 9, wherein the thickness of the selected barrier layer(s) in each block is set to satisfy a relation a<c.

13. A Group III nitride semiconductor light-emitting device according to claim 7, wherein a ratio a/b is $0.7 \leq a/b \leq 0.9$ in a case of a<b<c, and a ratio c/b is $0.7 \leq c/b \leq 0.9$ in a case of c<b<a.

14. A Group III nitride semiconductor light-emitting device according to claim 8, wherein a ratio a/b is $0.7 \leq a/b \leq 0.9$ in a case of a<b<c, and a ratio c/b is $0.7 \leq c/b \leq 0.9$ in a case of c<b<a.

15. A Group III nitride semiconductor light-emitting device according to claim 9, wherein a ratio a/b is $0.7 \leq a/b \leq 0.9$ in a case of a<b<c, and a ratio c/b is $0.7 \leq c/b \leq 0.9$ in a case of c<b<a.

16. A Group III nitride semiconductor light-emitting device comprising:
   at least an n-type-layer-side cladding layer;
      a light-emitting layer comprising a multiple quantum structure comprising a plurality of layer units, each unit comprising at least a well layer, a first barrier layer comprising $Al_{x1}Ga_{1-x1}N$ (0<x1<1), and a second barrier layer comprising $Al_{x2}Ga_{1-x2}N$ (0<x2<1) with an Al composition ratio x2 which is more than an Al composition ratio x1 of the first barrier layer; and a p-type-layer-side cladding layer, each of the n-type-layer-side cladding layer, the light-emitting layer, and the p-type-layer-side cladding layer comprising a Group III nitride semiconductor, wherein, the light-emitting layer comprises a first block, a second block, and a third block in a thickness direction from the n-type-layer-side cladding layer to the p-type-layer-side cladding layer, an Al composition ratio of a selected barrier layer which is at least one of the first barrier layer and the second barrier layer in each block is the same in the first, second, and third blocks, and the thickness of the selected barrier layer(s) in each block is set so as to satisfy a<b<c where an average thickness of the selected barrier layer(s) in the first block is represented as a, an average thickness of the selected barrier layer(s) in the second block as b, and an average thickness of the selected barrier layer(s) in the third block as c.

17. A Group III nitride semiconductor light-emitting device according to claim 16, wherein a number of the selected barrier layer(s) in the first block is equal to a number of the selected barrier layer(s) in the third block, and a thickness of the selected barrier layer(s) in each block is set so as to satisfy a relation a+c=2b.

18. A Group III nitride semiconductor light-emitting device according to claim 17, wherein a ratio a/b is 0.7≤a/b≤0.9.

19. A Group III nitride semiconductor light-emitting device according to claim 1, wherein a band gap of the selected barrier layer(s) widens as the selected barrier layer(s) approach the n-type-layer-side cladding layer.

20. A Group III nitride semiconductor light-emitting device according to claim 1, wherein a thickness of the selected barrier layer(s) increases as the selected barrier layer(s) approach the p-type-layer-side cladding layer.

* * * * *